(12) United States Patent
Cattaneo et al.

(10) Patent No.: US 7,193,408 B2
(45) Date of Patent: Mar. 20, 2007

(54) OPEN-LOOP ELECTRIC CURRENT SENSOR AND A POWER SUPPLY CIRCUIT PROVIDED WITH SUCH SENSORS

(75) Inventors: Pierre Cattaneo, Collonges-sous-Saléve (FR); Claude Gudel, Le Pas de l'Echelle (FR)

(73) Assignee: Liaisons Electroniques-Mechaniques LEM S.A., Plan-les-Ouates (CH)

( * ) Notice: Subject to any disclaimer, the term of this patent is extended or adjusted under 35 U.S.C. 154(b) by 0 days.

(21) Appl. No.: 10/887,288

(22) Filed: Jul. 8, 2004

(65) Prior Publication Data

US 2005/0007095 A1    Jan. 13, 2005

(30) Foreign Application Priority Data

Jul. 12, 2003    (EP) .................. 03015934

(51) Int. Cl.
*G01R 15/18*    (2006.01)
(52) U.S. Cl. ................................. 324/117 R
(58) Field of Classification Search ............ 324/117 R, 324/117 H, 158.1, 765, 127, 142, 126
See application file for complete search history.

(56) References Cited

U.S. PATENT DOCUMENTS

| | | | |
|---|---|---|---|
| 3,192,373 A | | 6/1965 | Engel |
| 4,488,112 A | | 12/1984 | Thompson et al. |
| 4,799,005 A | * | 1/1989 | Fernandes .................. 324/127 |
| 4,823,075 A | * | 4/1989 | Alley .................... 324/117 H |
| 5,250,894 A | * | 10/1993 | Bridges et al. ......... 324/117 H |
| 5,450,000 A | | 9/1995 | Olsen |
| 6,005,383 A | * | 12/1999 | Savary et al. ............ 324/117 H |
| 6,445,171 B2 | * | 9/2002 | Sandquist et al. ...... 324/117 R |

FOREIGN PATENT DOCUMENTS

| | | |
|---|---|---|
| DE | 3039679 A1 | 4/1982 |
| DE | 10011047 A1 | 9/2001 |
| DE | 10023837 A1 | 11/2001 |
| DE | 10028448 A1 | 1/2002 |
| EP | 0475880 A2 | 3/1992 |
| EP | 0538658 B1 | 4/1993 |
| EP | 0578948 A1 | 1/1994 |
| EP | 0616346 B1 | 9/1994 |
| EP | 0933640 A2 | 8/1999 |
| EP | 0815456 B1 | 9/1999 |
| EP | 1074846 A2 | 2/2001 |
| FR | 2331029 | 6/1977 |
| FR | 2594551 | 8/1987 |

OTHER PUBLICATIONS

Ogasawara, Satoshi et al., A Digital Current Sensor for PWM Inverters, IEEE Industry Applications Society Annual Meeting/Conference Record/92, Dec. 1, 1992, pp. 949-955.

* cited by examiner

*Primary Examiner*—Ha Tran Nguyen
*Assistant Examiner*—Tung X. Nguyen
(74) *Attorney, Agent, or Firm*—Clifford W. Browning; Krieg DeVault LLP

(57) ABSTRACT

An open-loop current sensor comprising a magnetic circuit having an air gap, a magnetic field detector disposed in the air gap, and a primary conductor having one or more turns surrounding the magnetic circuit, the current to be measured flowing in the primary conductor, the sensor being characterised in that the turns of the primary conductor are disposed close to the air gap, on each side of the air gap.

5 Claims, 6 Drawing Sheets

OPEN-LOOP ELECTRIC CURRENT SENSOR AND A POWER SUPPLY CIRCUIT PROVIDED WITH SUCH SENSORS

The present invention concerns an open-loop current sensor, in particular a current sensor for measuring current in power circuits or circuits supplying electric motors, as well as a supply circuit provided with such sensors.

BACKGROUND OF THE INVENTION

In modern supply circuits 106, as shown in FIG. 1, the supply current of the motor 105 is generated by semiconductor switches 103 switched at high frequency. The current I(t) actually generated typically has a frequency of a few tens of kHz, whilst the fundamental frequency If of the supply current, having a sinusoidal shape overall represented by the envelope of the current I(t), is relatively low, for example around a few hundreds of Hz, as illustrated in FIG. 2a. The technological advances achieved in the design of power semiconductors enable the switches 103 to have extremely high switching speeds, the potential variation speed dv/dt being for example around 10 to 20 kV/μs, as illustrated in FIG. 2b. In order to contain the electrical radiation caused by such potential variation speeds, use is made of coaxial cables 104 for supplying the motor 105. Since these cables are highly capacitive, and having regard to the dv/dt applied, stray high-frequency (HF) currents are generated in the form of oscillations damped at each switching. The amplitude and frequency of these currents are of the same order of magnitude whatever the driving power. This is because they depend practically only on the characteristics of the coaxial cables used and the amplitude of the dv/dt applied. The amplitude of these currents can reach several tens of amperes and their frequencies range from 100 kHz to 1 MHz.

The current sensors 101 are generally placed on lines 102a, 102b, 102c supplying the motor 105. Although these HF currents do not have to be measured, they nevertheless pass through the current sensors. In drives 106 of small and medium power, the amplitude of these stray currents may be much higher than those of the currents necessary for controlling the motor. FIG. 2c shows, on an oscilloscope screen, the voltage U(t) and the high-frequency current I(t) due to the switchings and to the capacitive loads on one phase of a 5.5 kW motor supplied by a supply circuit switched at 16 kHz. In this example, the amplitude of the first and second half-wave $I_1, I_2$ is approximately 20 A and 8 A respectively. In practice an amplitude at the first half-wave $I_1$ and $I_2$ of 20 A and 30 A peak is normal.

The inventors have realised that this causes two main problems. The first is an increase in the thermal current passing through the sensor, which can be resolved by sizing the sensor as a function of the sum of the rms currents which pass through it. Another problem is very great heating of the magnetic circuit due to losses by hysteresis and losses by eddy currents.

It is necessary to emphasise that these problems are not found in sensors of the "closed loop" type since, to within any compensation errors, the primary ampere-turns (At) are compensated for by the secondary ampere-turns.

It should be noted that the heating of the magnetic circuit will be all the higher, and therefore difficult, the smaller the size of the sensor. This is due to the sizing constraints with small open-loop current sensors. This is because, for reasons of measuring precision, it is not appropriate to design a sensor below a minimum level of 40 ampere-turns. This means that a sensor of nominal size 10 A will be designed with 4 primary turns whilst a 40 A nominal sensor can be designed with simply 1 primary turn. Thus, in the first case, the amplitude of the HF currents and the resulting magnetic induction will be multiplied by 4 compared with the second case and consequently the heating due to the losses by hysteresis and the dynamic losses will be 16 times greater, as can be deduced from the following relationship:

$$\text{Losses}_{(W)} \approx f^2 B^2 d^2 / \phi$$

where d is the thickness of the magnetic plates, B is the magnetic induction, f is the frequency of the induction and therefore of the stray current HF and φ is the resistivity of the ferromagnetic alloy constituting the magnetic circuit of the sensor.

Tests show that temperatures from 200° C. to 300° C., or even more, would be reached with open-loop sensors of small size and traditional construction if they were used as they stood in the applications described above.

In practice, this type of sensor can be used only if there is disposed on its primary connections a related circuit which diverts the HF currents; however, this circuit has the drawback of destroying the dynamic performance of the sensor and thus restricts the efficiency of the drive. For these reasons, this type of sensor is not, up to the present time, used in drives for high-performance motors; it is replaced by a sensor of the more expensive "closed loop" type.

SUMMARY OF THE INVENTION

In the light of the above, one aim of the invention is to produce an open-loop current sensor having the required dynamic performance and which can withstand high currents flowing in the primary conductor. Another aim of the invention is to provide a power supply circuit provided with such sensors.

It is advantageous to produce an open-loop current sensor able to withstand stray HF currents generated by high potential variation speeds (dv/dt), as present in semiconductor switching circuits for supplying electric motors.

It is advantageous to produce a compact and inexpensive open-loop sensor.

Aims of the invention are achieved by an open-loop sensor according to claim 1 and a power supply circuit according to claim 5.

The open-loop current sensor comprises a magnetic circuit having an air gap, a magnetic field detector disposed in the air gap, and a primary conductor, in which the current to be measured flows, having one or more turns surrounding the magnetic circuit. The open-loop current sensor is characterised in that in the turns of the primary conductor are disposed close to the air gap, on each side of the air gap. In this part of the magnetic circuit, the local permeability is much lower than in all the other parts of the magnetic circuit because of the presence of the air gap ($\mu_{air}=1$). Because of the primary turns, the effective permeability of the magnetic circuit is much lower. Because of this, for the same primary ampere-turns value, the magnetic induction in the magnetic core (also referred to as the "iron") is locally, but also overall, lower. Consequently the losses by hysteresis and by eddy currents are minimised.

BRIEF DESCRIPTION OF THE DRAWINGS

Other aims and advantageous aspects of the invention will emerge from the description, the claims and the accompanying drawings, in which:

FIG. 6a concerns a sensor with: eight primary turns with flowing through it a current of 5 A, that is to say 40 At; an iron-silicon magnetic circuit having an air gap 1.3 mm long and consisting of a stack of eight plates 0.35 mm thick; its cross-section is 9.8 mm$^2$ and its average length measures 40 mm;

FIG. 6b concerns a sensor with: twelve primary turns with flowing through it a current of 3.33 A, that is to say 40 At; an iron-nickel magnetic circuit, having an air gap 1.3 mm long and consisting of a stack of eight plates 0.35 mm thick; its cross-section is 10 mm$^2$ and its average length measures 35 mm.

DETAILED DESCRIPTION

Figure 1:
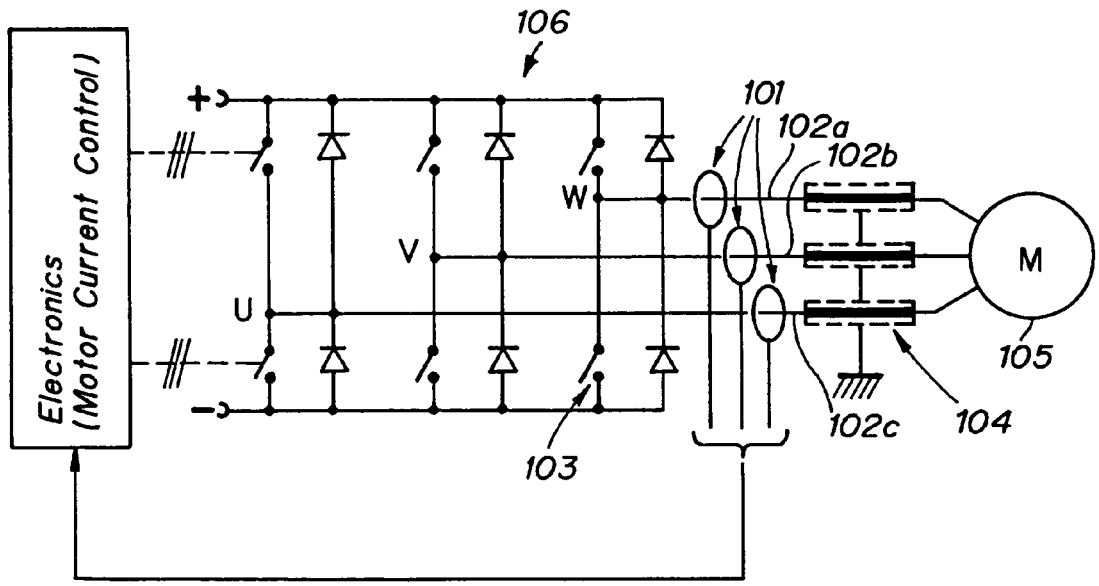
FIG. 1 is a schematic view of a circuit supplying electric current to an electric motor.
Figure 2A:
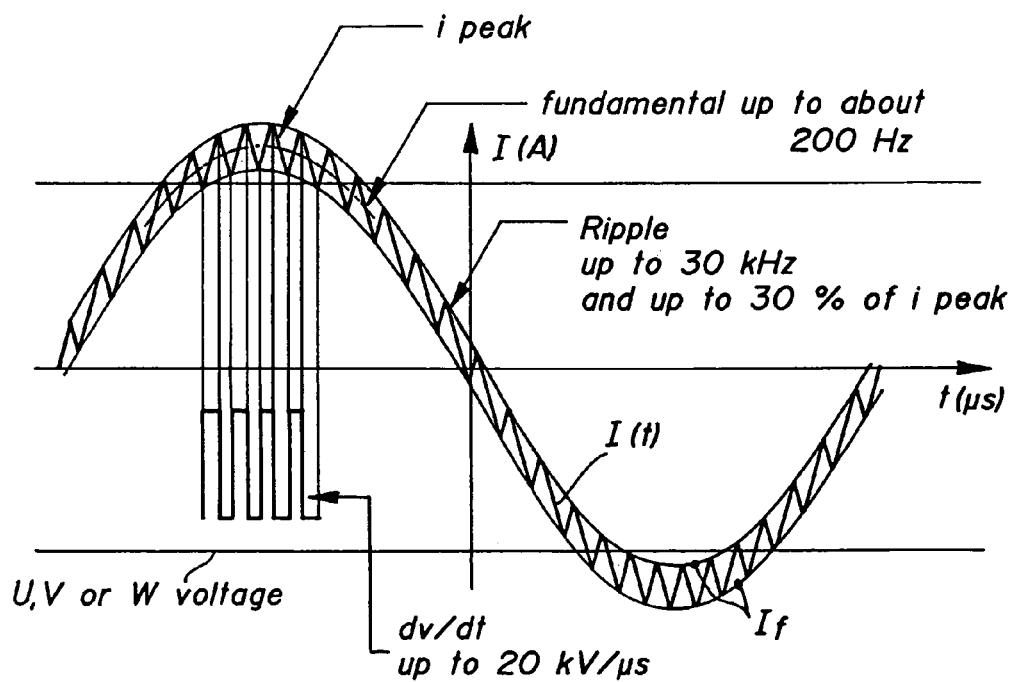
FIG. 2a is a graphical representation of the current and the potential generated by the supply circuit on a phase connected to the motor.
Figure 2B:
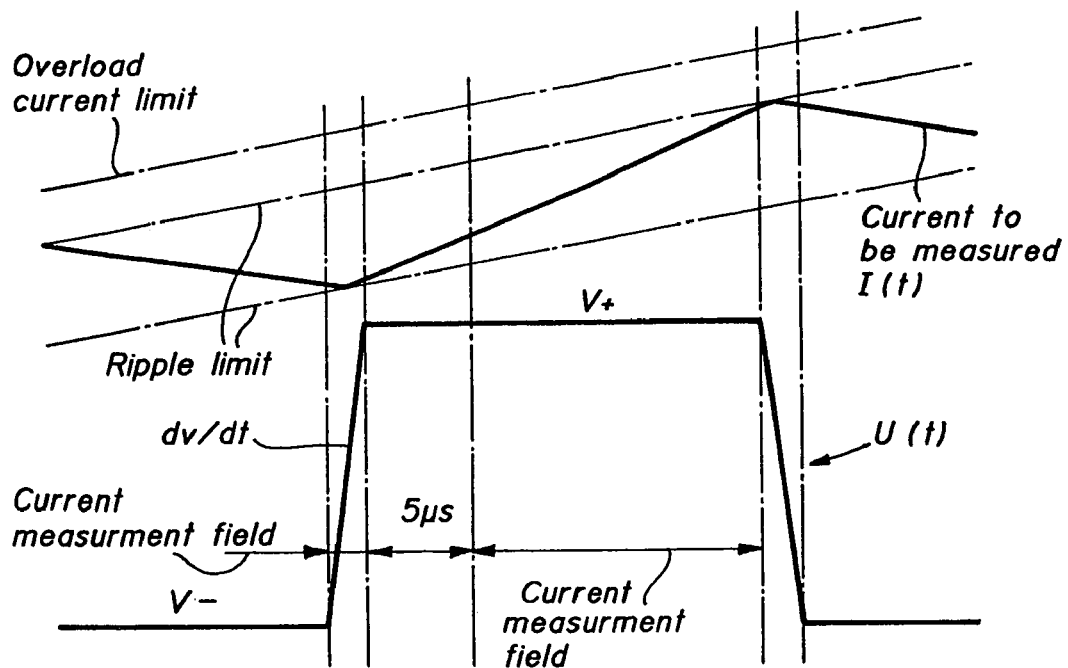
FIG. 2b is a representation in detail (enlarged) of the current and the potential generated by the supply circuit on a phase connected to the motor.
Figure 3:
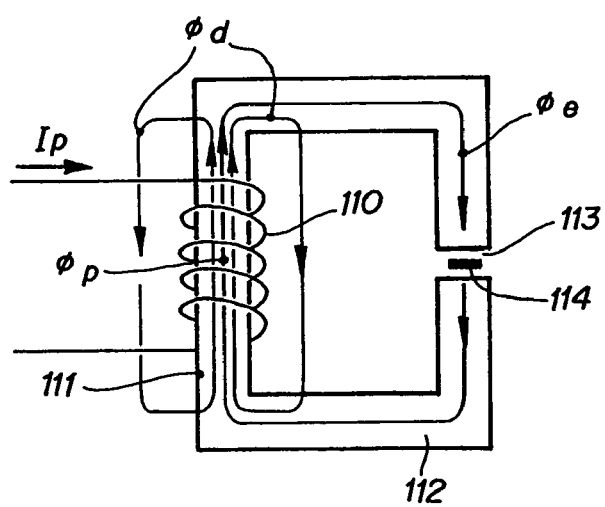
FIG. 3 is a simplified view of a conventional open-loop current sensor showing the magnetic flux lines.

In known open-loop sensors, whatever the form of the magnetic circuit, the coil 110 (see FIG. 3) constituting the primary winding $N_p$ is normally placed on a sector, or on a branch 111 in the case of a rectangular magnetic circuit 112, situated directly opposite the air gap 113, as shown in FIG. 3. This location is actually the one which appears the most natural; it is also the one which appears the most logical from the point of view of practical implementation, since the primary winding can be more easily wound around the branch opposite to the air gap by passing the wire through the air gap.

However, the inventors have realised that this location proves unfavourable. This is because, if attention is paid to the magnetic phenomena which result from this arrangement, it is found that, in the portion of magnetic circuit 111 enclosed by the primary coil 110, the magnetic induction flux φ is much higher than in the rest of the circuit. This is due to the fact that, far from the air gap 113, the local permeability $\mu_r$, seen from the point where the primary turns are placed, tends towards the value of that of the magnetic material used, and it will be recalled that φ=B×S and B=μH and therefore φ=μH×s, where B is the magnetic induction, S is the cross-section of the coil, H is the magnetic flux and μ the permeability. Moreover, because of the presence of the air gap, a major part of the magnetic induction flux generated by the primary ampere-turns (principal flux $\phi_p$) will close up on itself outside the magnetic circuit (dispersion flux $\phi_d$). The other part $\phi_e$ closes up through the magnetic circuit and through the air gap 113 where the measurement is made by a magnetic field detector 114, such as a Hall cell.

Thus more non-useful flux is generated than useful flux. The non-useful flux considerably increases the dynamic losses, the losses by hysteresis and the heating which results therefrom.

Figure 4A:
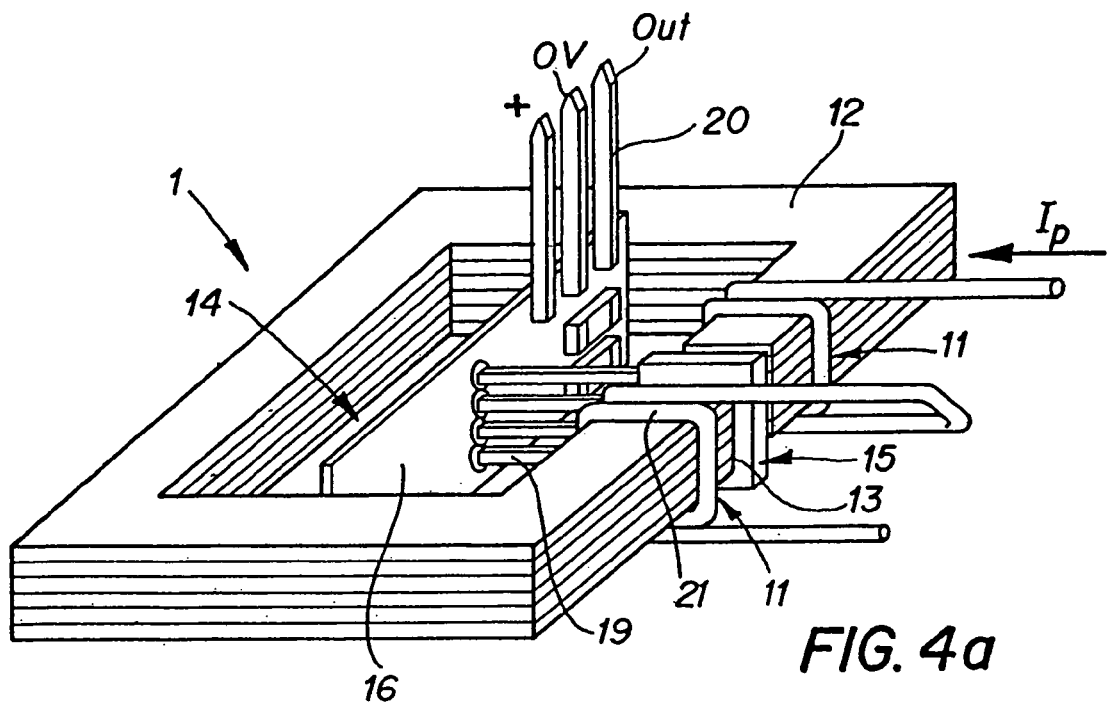
FIG. 4a is a perspective view of an open-loop current sensor according to the invention.
Figure 4B:
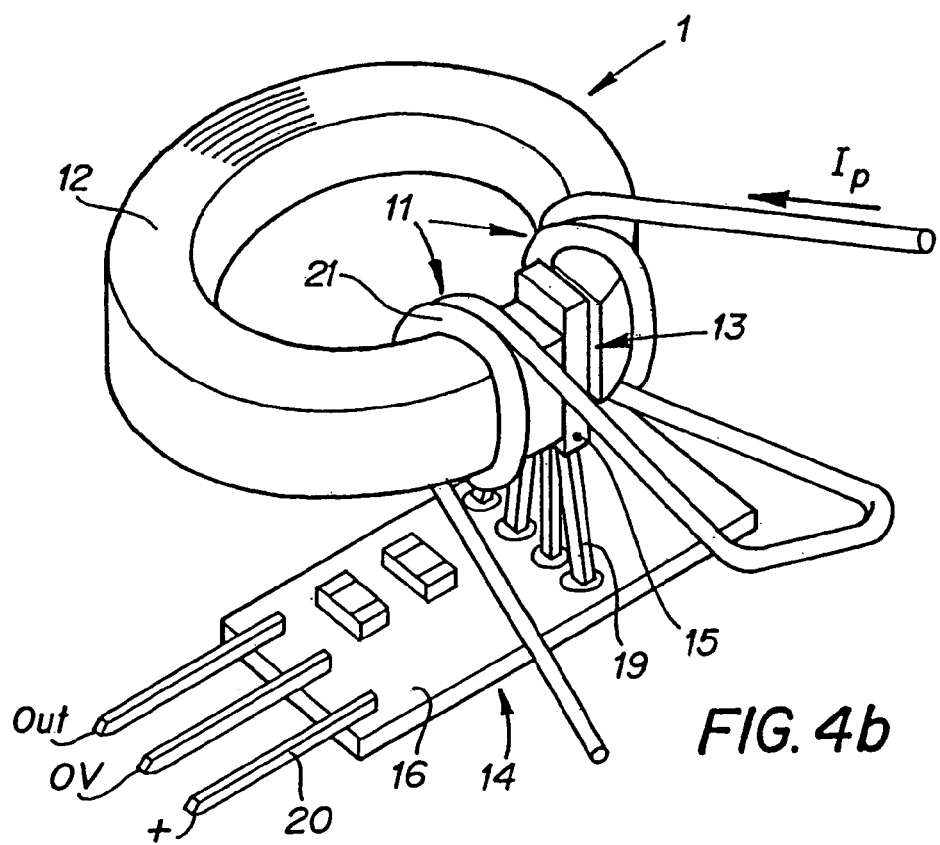
FIG. 4b is a perspective view of a variant of an open-loop current sensor according to the invention.

With reference to FIGS. 4a to 4b, an open-loop sensor 1 according to the invention comprises a magnetic circuit 12 comprising a magnetic core having an air gap 13, an element for measuring the magnetic induction 14 comprising a cell for measuring the magnetic induction 15 disposed in the air gap, and a primary conductor 11 having one or more turns surrounding the magnetic circuit. The current to be measured $I_p$ (also referred to as the primary current) flows in the primary conductor. The measuring cell can for example be a Hall-effect sensor mounted on a printed circuit 16 of the measuring element, the circuit comprising conductive tracks connecting terminals 19 of the measuring cell to terminals 20 intended to be connected to an external measuring signal processing unit.

Figure 4C:
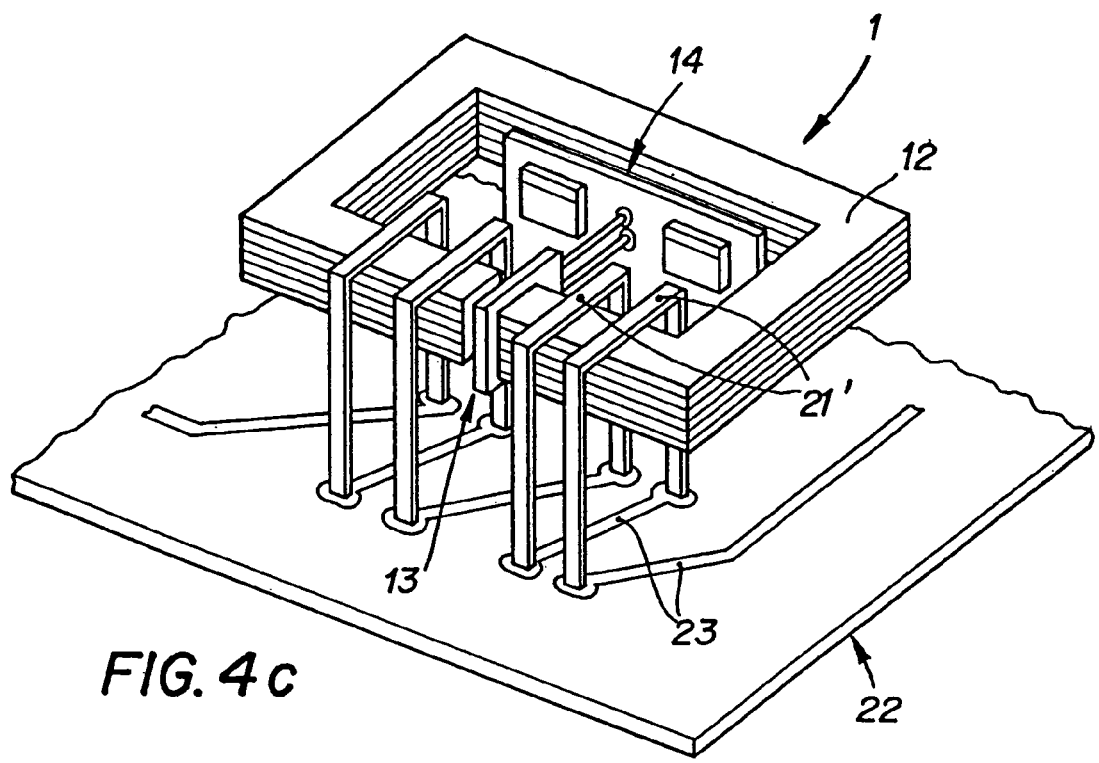
FIG. 4c is a perspective view of a variant of an open-loop current sensor according to the invention.

The turns 21 of the primary conductor 11 are disposed around the magnetic core 12 on each side of and as close as possible to the air gap 13. The turns are illustrated as being in the form of turns of a wire. The turns can however take many other forms. For example (see FIG. 4c), the turns can be U-shaped conductors 21', for example stamped metal sheet, surrounding the magnetic circuit 12 and connected for example to a printed circuit 22 provided with conductive tracks 23 connecting the U-shaped conductors. It should also be noted that two U-shaped conductors, one on each side of the air gap, can represent a single turn if they are electrically connected in parallel, for example by the conductive tracks on a printed circuit.

In the part of the magnetic circuit close to the air gap, the local permeability is much lower than in all the other parts of the magnetic circuit because of the presence of the air gap ($\mu_{air}$=1). Because of this, for the same value of primary ampere-turns, the magnetic induction in the material of the magnetic circuit is locally, but also overall, lower. Consequently the total losses and the heating which result therefrom are also lower. Moreover, the dispersion flux is also lower, since the magnetic induction is lower. There is thus a tendency to generate only useful flux. It should be stated that the induction in the air gap does not depend on the position of the primary turns, as is clear from the following explanation:

An open-loop current sensor is an application of Ampere's theorem (I=∫H·dL) which can be written, in the practical case of a magnetic circuit with air gap:

$$N_p \times I_p = H_{air} \times I_{air} + H_{iron} \times I_{iron}$$

however H=B/μ and therefore:

$$N_p \times I_p = B_{air} \times I_{air} / \mu_o \times \mu_{air} + B_{iron} \times I_{iron} / \mu_o \times \mu_r$$

where $N_p$ is the number of primary turns, $I_p$ is the primary current, $H_{air}$ is the magnetic field flowing in the air gap, $I_{air}$ is the length of the air gap, $H_{iron}$ is the magnetic field flowing in the core of the magnetic circuit, $I_{iron}$ is the length of the magnetic core, $B_{air}$ is the magnetic induction in the air gap, $B_{iron}$ is the magnetic induction in the magnetic core, $\mu_{air}$ is the magnetic permeability in the air, $\mu_r$ is the magnetic permeability in the magnetic core and Po is a constant having the value $4\pi10^{-7}$.

Knowing that the relative permeability of the air $\mu_{air}=1$, and starting from the simplifying assumption that the induction in the air gap is equal to the induction in the iron, it is possible to write:

$$N_p \times I_p \times \mu_o = B \times (I_{air} + I_{iron}/\mu_r)$$

and $$N_p \times I_p \times \mu_o / I_{air} + I_{iron}/\mu_r = B_{air}$$

However, in our case, $I_{iron}$ is small, whilst $\mu_r$ is very large (>100,000), and therefore the ratio $I_{iron}/\mu_r$ is negligible.

Finally, the density of the magnetic flux measured by the Hall element in the air gap is:

$$B_{air} = 4\pi 10^{-7} \times N_p \times I_p / I_{air}$$

It should be stated however that it is practically impossible to calculate the induction values and therefore the total losses, in the case of a magnetic circuit with air gap, since the results depend on the geometric form of the magnetic assembly. Only the use of appropriate software and/or tests make it possible to evaluate the magnetic induction and the heating.

Figure 6A:
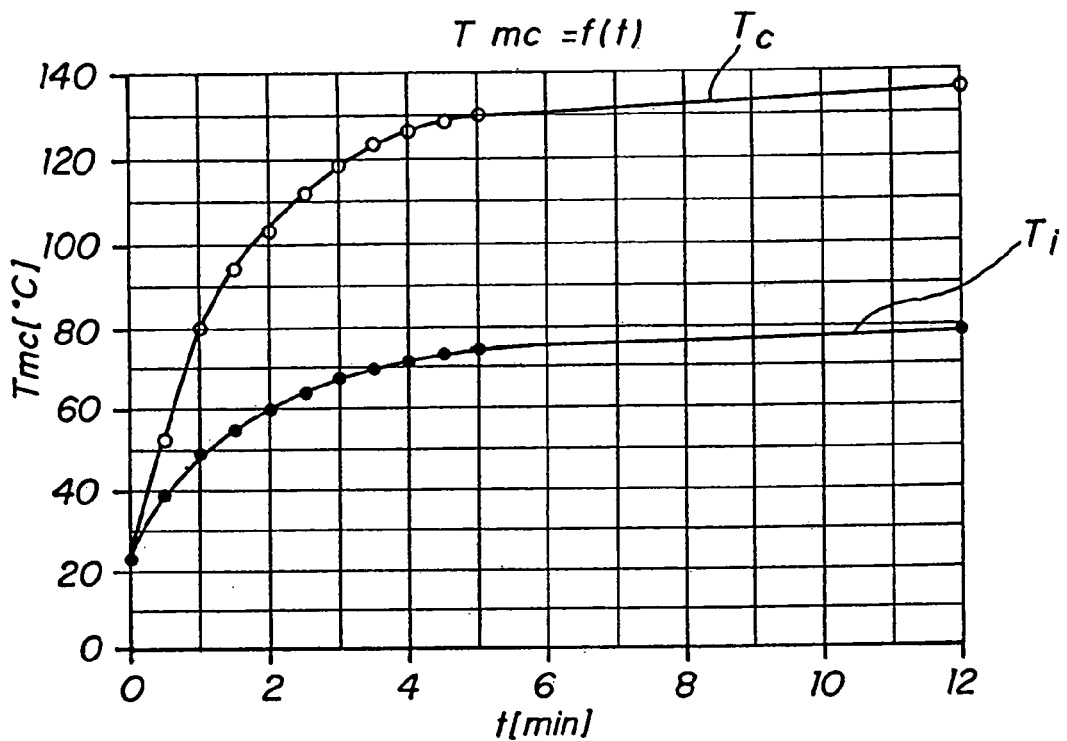
FIGS. 6a and 6b are graphs showing the change in the temperature in the magnetic circuit of a conventional sensor, and respectively of a sensor according to the invention on a line supplied by a sinusoidal current having a frequency of 200 kHz.
Figure 6B:
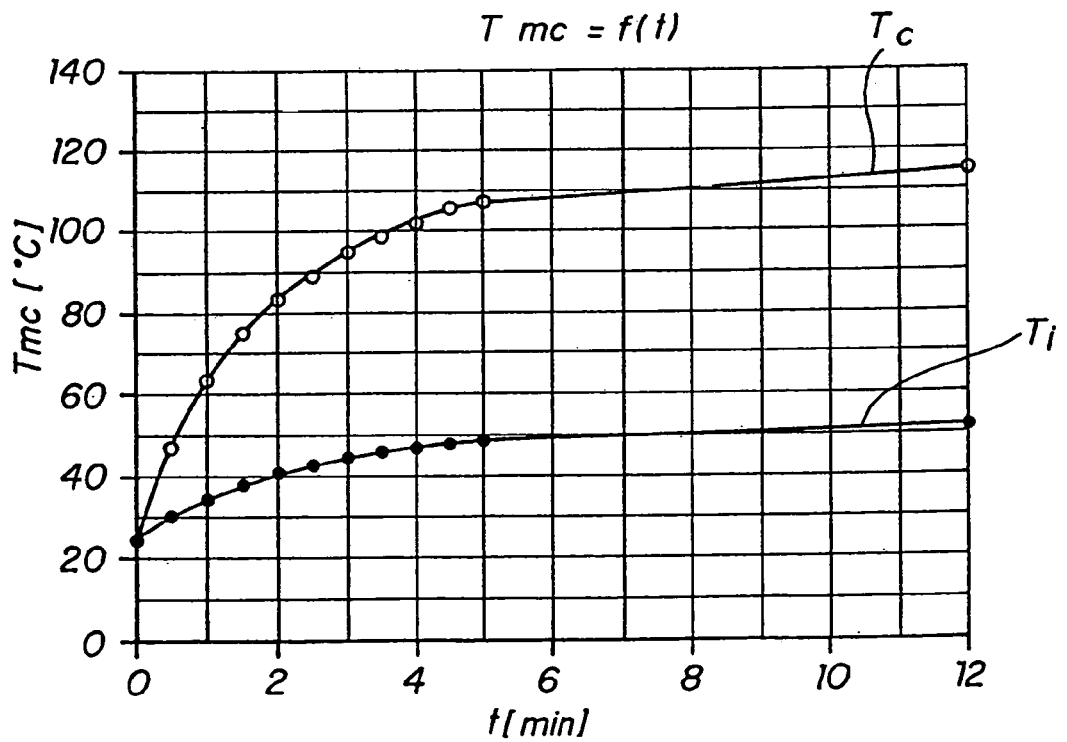

FIGS. 6a and 6b are graphs showing the change in the temperature in the magnetic circuit of a conventional sensor, and respectively of a sensor according to the invention on a line supplied with a sinusoidal current having a frequency of 200 kHz. FIG. 6a concerns a sensor with: an iron-silicon magnetic circuit having a 1.3 mm long air gap and consisting of a stack of eight plates 0.35 mm thick; its cross-section is 9.8 mm² and its average length measures 40 mm. FIG. 6b concerns a sensor with: an iron-nickel magnetic circuit having an air gap 1.3 mm long and consisting of a stack of eight plates 0.35 mm thick; its cross-section is 10 mm² and its average length measures 35 mm. The sensor in FIG. 6a comprises eight primary turns with flowing through it a current of 5 A, that is to say 40 At. The sensor in FIG. 6b comprises twelve primary turns with flowing through it a current of 3.33 A, that is to say 40 At.

In the case of the toroidal magnetic circuit according to FIG. 4b, it can be seen in the graph in FIG. 6a that, after 12 minutes operation, the temperature $T_c$ of the magnetic circuit of the conventional sensor reaches approximately 136° C. (i.e. an increase of approximately 116° C.) whilst the temperature $T_i$ of the magnetic circuit of the sensor according to the invention reaches approximately 78° C. (i.e. an increase of approximately 58° C.). The heating of a sensor according to the invention is therefore approximately half that in a conventional sensor with the same shape and dimensions. In the case of the rectangular magnetic circuit according to FIG. 4a, it can be seen on the graph in FIG. 6b that, after 12 minutes operation, the temperature $T_c$ of the magnetic circuit of the conventional sensor reaches approximately 116° C. (i.e. an increase of approximately 96° C.) whilst the temperature $T_i$ of the magnetic circuit of the sensor according to the invention reaches approximately 52° C. (i.e. an increase of approximately 32° C.). The heating of a sensor according to the invention is therefore approximately one third of that in a conventional sensor with the same shape and dimensions.

Another advantage resulting from the sensor according to the invention is that the insertion inductance $L_{ins}$ of the sensor is lower.

This is because: $L_{ins}=N^2/R_m$ and $R_m=I/\mu\times S$ where N is the number of primary turns, $R_m$ is the magnetic reluctance, S is the effective cross-section of the air gap and I is the length of the air gap.

Figure 5:
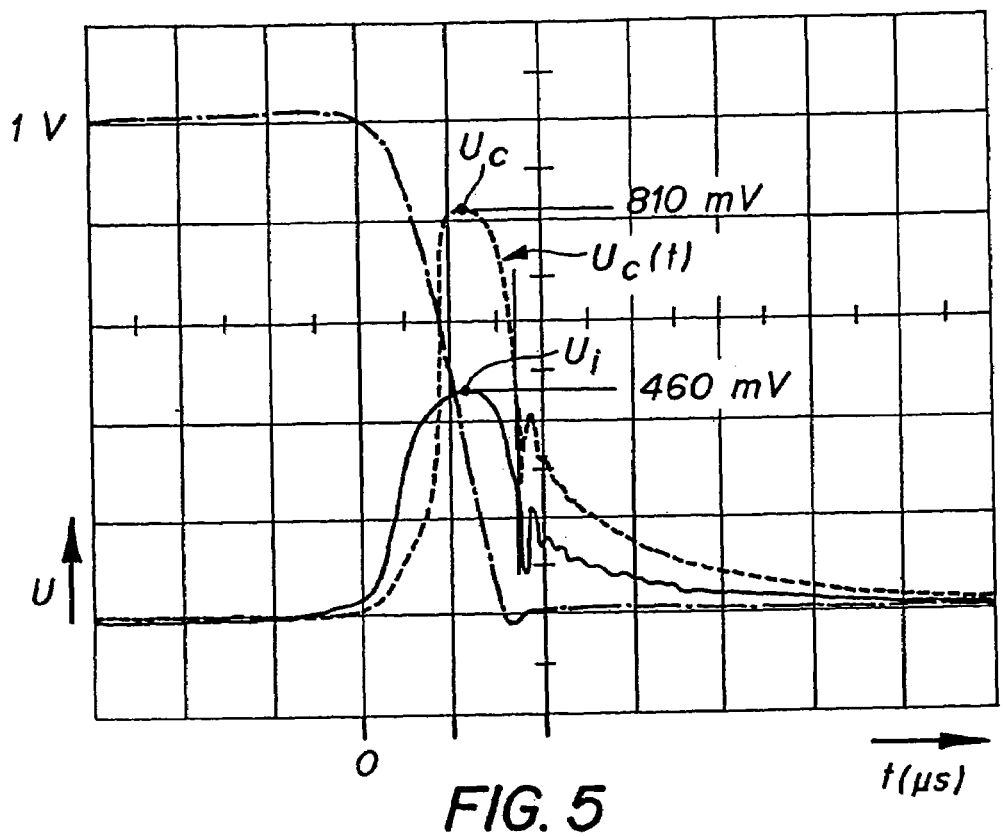
FIG. 5 is a graph showing the overvoltage V=L dI/dt at the terminals of the primary of a conventional sensor, and respectively of a sensor according to the invention.
Figure 2C:
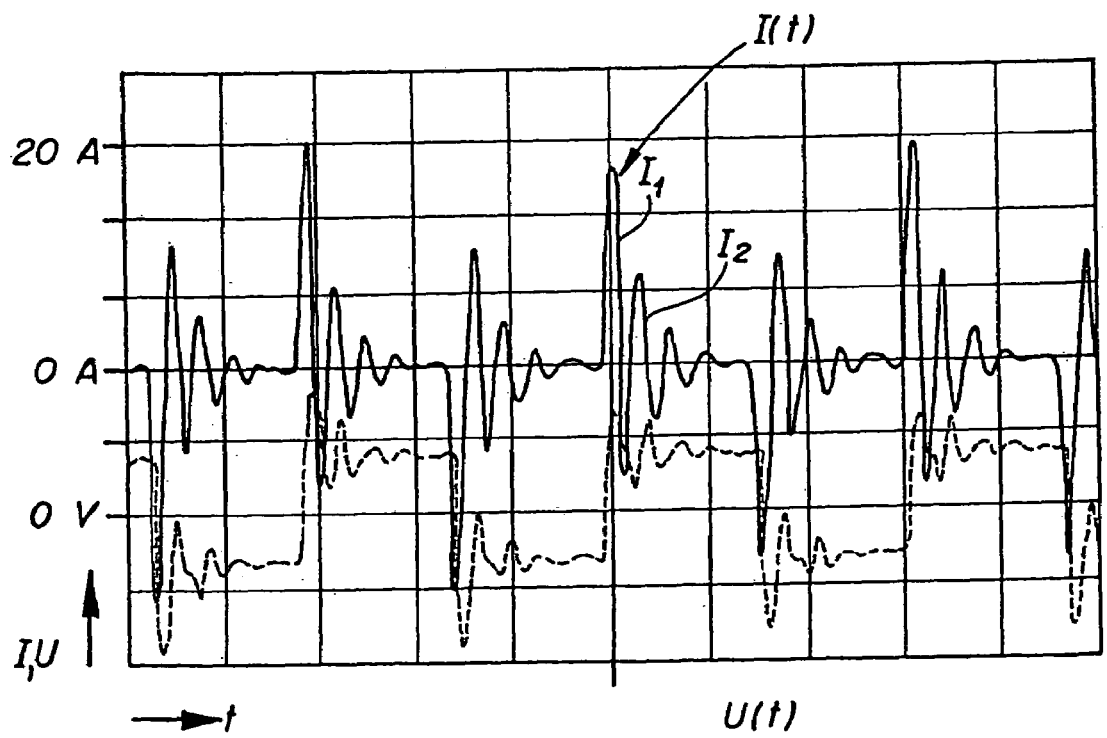
FIG. 2c is a view of an oscilloscope screen showing the phase output voltage and high-frequency current due to the switchings and capacitive loads on a phase.

However, in the sensor according to the invention, the permeability $\mu$ is lower and the cross-section S also, since the flux is more even because of the position of the primary coil close to the air gap. By way of example, FIG. 5 shows the voltage U as a function of time for a current variation speed $di/dt=40\cdot 10^6$ A/sec $$U(t) = L_{ins} \frac{di}{dt}$$

obtained with a conventional sensor (curve $U_c(t)$) and a sensor according to the invention (curve $U_i(t)$) with the same shape and dimensions, both having a single primary turn. It is seen that, for the conventional sensor, the peak voltage $U_c$ is 810 mV, which gives by calculation an insertion induction $L_{ins}$ of 0.02 µH, whilst for the sensor according to the invention the peak voltage $U_i$ is 460 mV, which gives by calculation an insertion induction $L_{ins}$ of 0.0115 µH.

Another advantage is that the cross-section of the magnetic core necessary for measuring a given current is lower because the magnetic induction in the core is lower, since the primary turns enclose a portion of the magnetic circuit where the apparent permeability is low.

Figure 7:
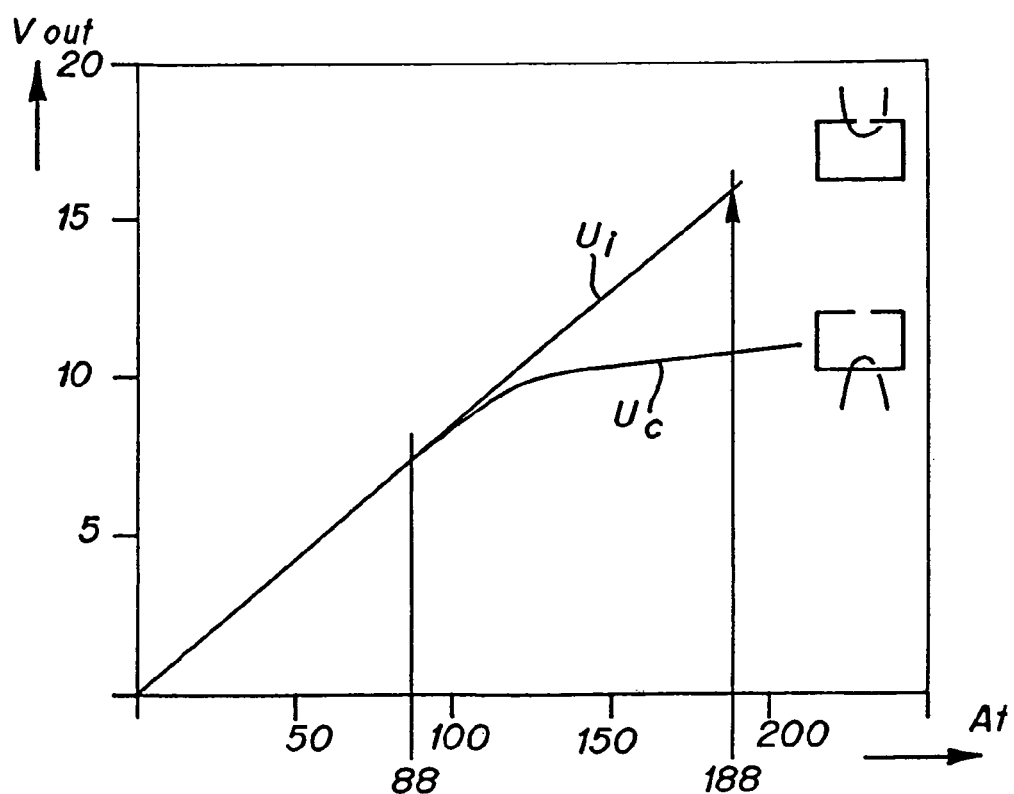
FIG. 7 is a graph of the output voltage $V_{out}$ of a conventional sensor, and respectively of a sensor according to the invention, according to the ampere-turns.

FIG. 7 shows that, with a sensor according to the invention, consisting of an iron-nickel magnetic circuit with approximately 80% nickel and a cross-section of 3.36 mm², the current measurement is linear up to 188 At, whilst in a conventional sensor with the same shape, dimensions and quality the measurement of the current is linear only up to 88 At.

In order to improve the sensor even further, it is possible to use a magnetic material for the core having low losses, such as for example iron-nickel alloys which have losses up to three times lower than those of the iron-silicon alloys normally used in these applications. Moreover it is possible to reduce the thickness d of the magnetic plates forming the core of the magnetic circuit. The most usual thickness in conventional sensors is 0.35 mm. The use of plates with a thickness of 0.2 mm can afford a reduction in losses by a factor of approximately three times.

In summary, the open-loop sensor according to the invention disclosed above affords the following advantages in a simple manner:

significant reduction in dynamic losses and losses by hysteresis significant reduction in the insertion induction of the sensors significant reduction in the cross-section of iron for measuring a given current, and therefore a reduction in the cost with regard to material.

The invention claimed is:

1. A current sensor comprising a magnetic circuit having an air gap, a magnetic field detector disposed in the air gap, and a primary conductor having one or more turns surrounding the magnetic circuit, the current to be measured flowing in the primary conductor, the sensor being characterized in that it is an open-loop current sensor, and in that the turns of the primary conductor are disposed close to the air gap, on each side of the air gap.

2. A sensor according to claim 1, wherein the turns of the primary conductor are disposed symmetrically on each side of the air gap.

3. A sensor according to claim 1, wherein the turns of the primary conductor comprise a U-shaped part stamped and mounted on a printed circuit.

4. A current sensor according to claim 1, wherein the turns of the primary conductor on each side of the air gap are connected in parallel.

5. A power supply circuit comprising semiconductor switches for generating a sinusoidal alternating current supplied on one or more supply lines of a load, such as an electric motor, and a current sensor disposed on each line, the current sensor comprising a magnetic circuit having an air gap, a magnetic field detector disposed in the air gap, and a primary conductor having one or more turns surrounding the magnetic circuit, the current to be measured flowing in the primary conductor, the sensor being characterized in that it is an open-loop current sensor, and in that the turns of the primary conductor are disposed close to the air gap on each side of the air gap.

* * * * *